United States Patent
Lim et al.

(10) Patent No.: US 10,262,732 B2
(45) Date of Patent: Apr. 16, 2019

(54) PROGRAMMABLE ARRAY LOGIC CIRCUIT AND OPERATING METHOD THEREOF

(71) Applicant: Winbond Electronics Corp., Taichung (TW)

(72) Inventors: Seow Fong Lim, San Jose, CA (US); Chi-Shun Lin, San Jose, CA (US); Douk-Hyoun Ryu, San Jose, CA (US); Ngatik Cheung, San Jose, CA (US)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 15/960,569

(22) Filed: Apr. 24, 2018

(65) Prior Publication Data

US 2019/0043575 A1     Feb. 7, 2019

Related U.S. Application Data

(60) Provisional application No. 62/541,090, filed on Aug. 3, 2017.

(51) Int. Cl.
  *H03K 19/003*  (2006.01)
  *G11C 13/00*   (2006.01)
  *H03K 19/00*   (2006.01)

(52) U.S. Cl.
  CPC ........ *G11C 13/0033* (2013.01); *G11C 13/004* (2013.01); *G11C 13/0069* (2013.01);
  (Continued)

(58) Field of Classification Search
  None
  See application file for complete search history.

(56) References Cited

U.S. PATENT DOCUMENTS 4,893,033 A   1/1990 Itano et al.
4,926,384 A   5/1990 Roy
(Continued)

FOREIGN PATENT DOCUMENTS

EP   0926825   6/1999

OTHER PUBLICATIONS

Su et al., "A 462GOPs/J RRAM-based nonvolatile intelligent processor for energy harvesting IoE system featuring nonvolatile logics and processing-in-memory," 2017 Symposium on VLSI Technology, Jun. 5-8, 2017, pp. 1-2.
(Continued)

*Primary Examiner* — Minh D A
*Assistant Examiner* — James H Cho
(74) *Attorney, Agent, or Firm* — JCIPRNET (57) ABSTRACT

This disclosure introduces a programmable array logic (PAL) circuit and a method which are capable of preventing a read disturbance effect on memory cells of the PAL circuit. The PAL circuit comprises a memory array coupled to a plurality of input lines and a plurality of source lines, a plurality of input transition detection (ITD) circuits, a pulse generator and a plurality of sense amplifiers. The plurality of ITD circuits detect a transition in level of the plurality of input signals in the input lines. The pulse generator generates an enable signal according to the transition in level of the input signals. The sense amplifiers are enabled to sense the voltage levels of the source lines when the transition in levels of the input signals is detected, and the sense amplifiers are disabled when no transition in levels of the input signals is detected.

20 Claims, 4 Drawing Sheets

(52) U.S. Cl.
CPC ....... *H03K 19/003* (2013.01); *H03K 19/0008* (2013.01); *G11C 13/0097* (2013.01); *G11C 2013/009* (2013.01); *G11C 2013/0045* (2013.01)

(56) References Cited

U.S. PATENT DOCUMENTS

| | | | | |
|---|---|---|---|---|
| 5,475,321 | A | * | 12/1995 | Aoyama .......... H03K 19/17708 326/39 |
| 5,734,275 | A | * | 3/1998 | Ashmore, Jr. ......... G11C 7/067 327/50 |
| 5,757,718 | A | | 5/1998 | Suzuki |
| 6,049,487 | A | * | 4/2000 | Plants ...................... G11C 8/16 365/189.04 |
| 7,350,177 | B2 | | 3/2008 | Chung et al. |
| 8,279,659 | B2 | * | 10/2012 | Cho, II .................... G11C 7/08 365/154 |
| 9,659,646 | B1 | | 5/2017 | Asnaashari et al. |

OTHER PUBLICATIONS

Bang et al., "Adaptive Read Voltage Control for Improvement of Read Disturbance and Power Consumption in Cross-point ReRAM," Recent Advances in Circuits : Proceedings of the 19th International Conference on Circuits, Jul. 16-20, 2015, pp. 77-80.

"Office Action of Taiwan Counterpart Application," dated Dec. 7, 2018, p. 1-p. 8.

\* cited by examiner

PROGRAMMABLE ARRAY LOGIC CIRCUIT AND OPERATING METHOD THEREOF

CROSS-REFERENCE TO RELATED APPLICATION

This application claims the priority benefit of U.S. provisional application Ser. No. 62/541,090, filed on Aug. 3, 2017. The entirety of the above-mentioned patent application is hereby incorporated by reference herein and made a part of this specification.

1. Field of the Disclosure

The disclosure relates to a programmable array logic (PAL) circuit, and particularly relates to a PAL circuit and an operating method of the PAL circuit which are capable of preventing a read disturbance effect to memory cells thereof.

2. Description of Related Art

Programmable logic devices/circuits are commonly used in the electronic field and may be programmed to implement various kinds of combinational logic circuits. The programmable logic devices/circuits are referred to or used in programmable logic devices (PLDs), programmable logic arrays (PLAs), programmable array logic (PALs), field programmable logic arrays (FPLAs), complex programmable logic devices (CPLDs) and the like. In particular, PAL is consisted of a small memory core and additional output logics used to implement particular desired logic functions with few components. Such devices are used in a wide range of applications such as consumer electronics, computing, networking and communication, automotive, etc.

Read disturbance effect is one of the serious problems which may significantly reduce the performance and reliability of the PAL circuits. Since the PAL is operated at a supply voltage VDD, while memory included in the PAL is read without disturbance at a read voltage which is smaller than the supply voltage VDD, the PAL circuits is hard to be operated without read disturbance. Read disturbance may refer to a condition where reading a memory cell disturbs (causes errors in) the other memory cells (e.g., the memory cells that are in a same programming block or in a same erasure block).

A resistive random access memory (RRAM) is a type of nonvolatile memory that is being actively developed in the industry, which has advantages of having a low voltage for operations, spending a short time for writing and erasing, having a long memorizing time, performing non-destructive read operation, being capable of multi-state memory, having a simple structure and small required area. Consequently, RRAM has great potential in the applications in personal computers and electronic apparatuses in the future. However, since the read voltage of reading the RRAM is quite smaller than the supply voltage VDD of PAL, there is a challenge to implement low-power consuming memories, such as RRAMs, into PALs without read disturbance. Therefore, it is desirable to have a PAL circuit which is operated with reduced or without read disturbance and has improved performance and reliability.

SUMMARY OF THE DISCLOSURE

This disclosure introduces a PAL circuit and an operating method with reduced or without read disturbance effect on the memory cells of the PAL circuit and are capable of improving the performance and reliability of the PAL circuit. Furthermore, in an embodiment of the disclosure, the PAL circuit and the operating method are capable of reducing power consumption.

The PAL circuit of the present disclosure may include a memory array, a plurality of input transition detection (ITD) circuits, a pulse generator and a plurality of sense amplifiers. The memory array has a plurality of memory cells coupled to a plurality of source lines and a plurality of input lines to receive a plurality of input signals. The ITD circuits are coupled to the input lines and configured to detect a transition in levels of the input signals. The pulse generator is coupled to the ITD circuits and configured to generate an enable signal according to the transition in levels of the input signals. The sense amplifiers are coupled to the source lines and configured to sense voltage levels of the source lines according to the enable signal. The sense amplifiers are enabled to sense the voltage levels of the source lines when the transition in levels of the input signals is detected, and the sense amplifiers are disabled when no transition in levels of the input signals is detected.

The disclosure also introduces a method of performing an operation on a PAL circuit having a plurality of memory cells coupled to a plurality of input lines and a plurality of source lines. The method includes steps of: determining resistance states of the memory cells; providing a plurality of input signals to the input lines and detecting a transition in levels of the input signals; generating an enable signal according to the transition in levels of the input signals; and enabling a plurality of sense amplifiers to sense voltage levels in the source lines and output product terms according to the input signals according to the input signals, the resistance states of the memory cells and the enable signal, while disabling the sense amplifiers when no transition in levels of the input signals is detected.

In embodiments of the disclosure, the sense amplifiers are controlled according to the transition in levels of the input signals. As such, the read disturbance effect on the memory cells of the PAL circuit is prevented or reduced, and the performance and reliability of the PAL circuit are improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiment may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected" and "coupled," and variations thereof herein are used broadly and encompass direct and indirect connections and couplings.

Figure 1:
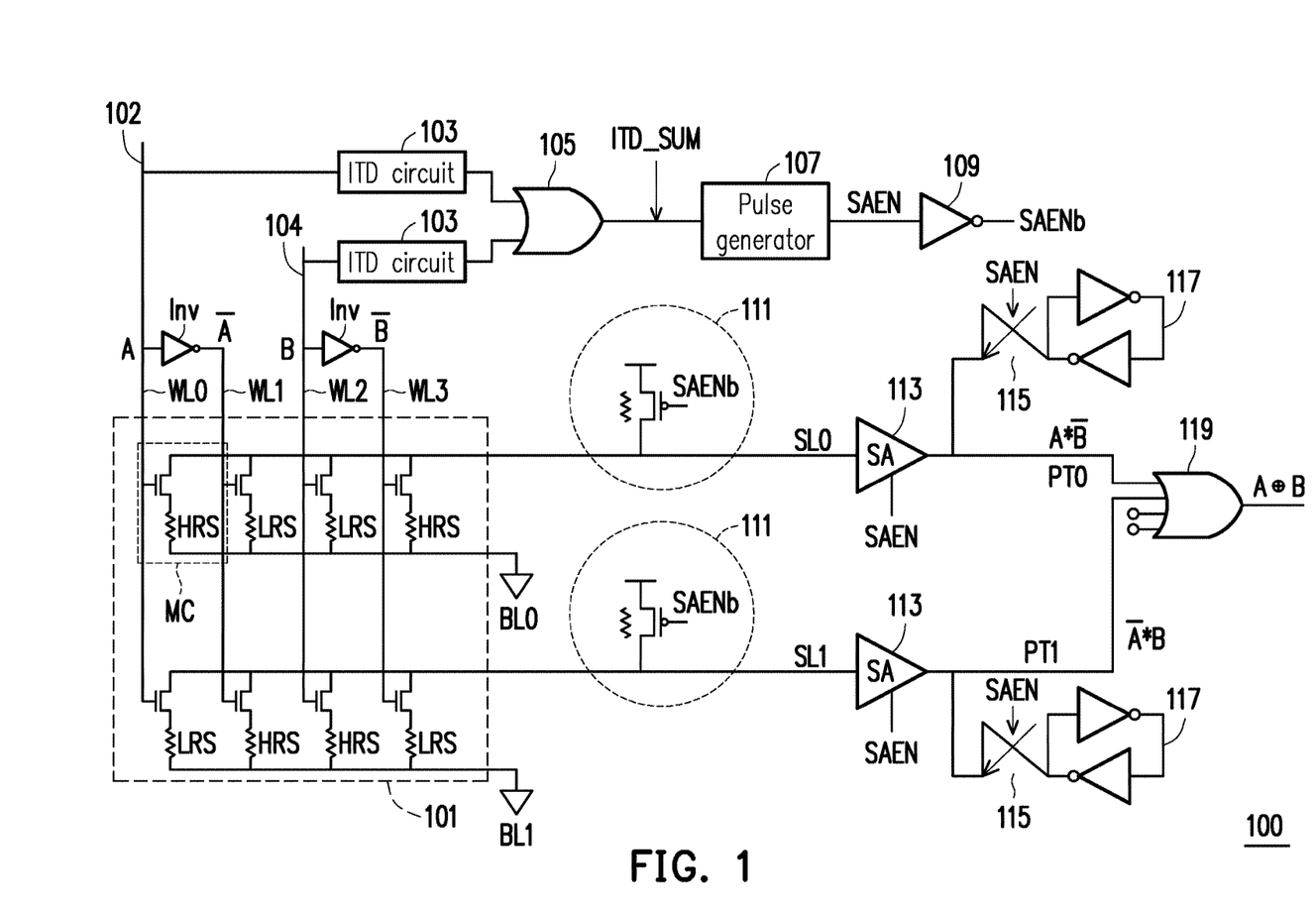
FIG. 1 illustrates a schematic diagram of a PAL circuit according to an embodiment of the disclosure.

Referring to FIG. 1, the PAL circuit 100 includes a memory array 101, a plurality of ITD circuits 103, a first logical circuit 105, a pulse generator 107, an inverter 109, a plurality of pull-up circuits 111, a plurality of sense amplifiers 113, a plurality of switches 115, a plurality of latches 117 and a third logical circuit 119. The memory array 101 includes a plurality of memory cells MC coupled to a plurality of input lines 102 and 104 to receive input signals, a plurality of source lines SL0 and SL1 and a plurality of bit lines BL0 and BL1. Each input line is connected to an inverter Inv and is divided into a plurality of word lines to be connected to an input of the inverter Inv and an output of the inverter Inv. In an embodiment of the disclosure, the input line 102 is divided into two word lines WL0, WL1, and the input line 104 is divided into two word lines WL2, WL3. Besides, it should be noted that two input lines 102 and 104, two source lines SL0 and SL1 and two bit lines BL0 and BL1 are shown in FIG. 1 for illustration purpose only. The number of word lines, bit lines and sources lines are determined according to the number of the memory cells MC of the memory array, and are not limited in this disclosure. Any number of the input lines, any number of the source lines, and any number of the bit lines fall within the scope of the disclosure.

In an embodiment of the disclosure, the PAL circuit 100 is a resistive random access memory (RRAM) based PAL circuit, where the memory cells MC are RRAM cells. The PAL circuit 100 may be RRAM-based processing-in-memory (PIM) circuit. The RRAM cells of the PAL circuit 100 may support simple write operations, where an erase operation is not required to be performed prior to a write operation. As shown in FIG. 1, each RRAM cells MC of the PAL circuit 100 includes one transistor and one resistive-switching element (which is also called as "1T1R"). The transistor has a gate connected to one of word lines WL0 to WL3, a source connected to one of source lines SL0 and SL1, and a drain connected to a first terminal of the resistive-switching element. A second terminal of the resistive-switching element is connected to ground via one of bit lines BL0 and BL1. In response to a high signal on an associated input line (e.g., input line 102), transistor coupled to the associated input is activated, thereby a default voltage on an associated source line is applied to the first terminal of an associated resistive-switching element. In various embodiments, the default voltage can have a magnitude equal to or larger than a read voltage associated with the resistive-switching element and smaller than a program voltage associated with the resistive-switching element. Accordingly, the default voltage will not change a low resistance state (LRS) of the resistive-switching element, but will generate an on-state current if the resistive-switching element is in the LRS, causing a voltage divider effect and reducing the default voltage on an associated source line to a reduced default voltage. In contrast, where an input line has a low voltage (deactivating transistor), or where the resistive-switching element is in a high resistance state (HRS), the default voltage on the source line is unaffected, or substantially unaffected. Alternatively, different memory architectures such as "2T2R", "4T4R", etc. may be applied to the memory cells MC of the PAL circuit. Furthermore, RRAM may include magnetoresistive random access memory (MRAM), phase change RAM (PRAM), ferroelectric RAM (FeRAM), conductive bridging RAM (CBRAM), metal-oxide RRAM, memristor, and the like. Besides, the memory cells MC of the PAL circuit may be one-time programmable non-volatile memory (OTP NVM).

In an embodiment of the disclosure, two columns of the memory cells MC are coupled to the word lines WL0 and WL2 which are connected to the inputs of the inverters Inv to receive the input signals A and B from the input lines 102 and 104 respectively. Another two columns of the memory cells MC are coupled to the word lines WL1 and WL 3 which are connected to the outputs of the inverters Inv to receive the inverted signals $\overline{A}$ and $\overline{B}$. For a RRAM cell, a conductive path or a filament forms through a non-volatile resistive switching layer of the RRAM cell in response to a suitable program voltage on the word lines applied across the RRAM cell, therefore the RRAM cell switches from HRS to LRS. In addition, an erase voltage can be provided to the word lines to deform the conductive filament, at least in part, causing the RRAM cell to return to the HRS from the LRS. For example, by applying the erase voltage to the word lines WL0 and WL3 and applying the program voltage to the word lines WL1 and WL2, the resistance states of the memory cells coupled to the source line SL0 are HRS, LRS, LRS, and HRS (from left to right) as depicted by FIG. 1. The voltage levels of the input lines 102 and 104 may be biased to avoid read disturbance, which may be a severer issue when the memory cells MC are RRAM cells.

Each of the ITD circuits 103 is coupled to one of the input lines 102 and 104 and is configured to detect a transition in levels of the input signal in the corresponding input line, and output an ITD signal according to the detected result. The transition may include a change from a high logical level (e.g., "1") to a low logical level (e.g., "0"), or a change from the low logical level (e.g., "0") to the high logical level (e.g., "1"). In an embodiment of the disclosure, two ITD circuits 103 are provided, in which one of the ITD circuits 103 is coupled to the input line 102 to receive the input signal A from the input line 102, detect the transition in levels of the input signal A, and output and a first ITD signal indicating whether the transition in levels occurs in the input signal A. Similarly, the other one of the ITD circuits 103 is coupled to the input line 104 to receive the input signal B from the input line 104, detect the transition in levels of the input signal B, and output a second ITD signal indicating whether the transition in levels occurs in the input signal B.

The first logical circuit 105 is coupled to the outputs of the ITD circuits 130 to receive the ITD signals and is configured to sum up the ITD signals to output a summed ITD signal ITD_SUM. As shown in FIG. 1, the first logical circuit 105 may be or includes an OR logical gate, and the summed ITD signal ITD_SUM is obtained by performing an OR operation on the received ITD signals.

The pulse generator 107 is coupled to the outputs of the first logical circuit 105 to receive the summed ITD signal ITD_SUM, and is configured to generate an enable signal SAEN according to the summed ITD signal ITD_SUM. In other words, the pulse generator 107 is coupled to the ITD circuits 103 through the first logical circuit 105 to generate the enable signal SAEN in response to the transition in levels of the input signals. The pulse generator 107 may be a one-pulse generator, where a single pulse is generated in response to the transition in levels of the input signals is detected.

The inverter 109 is coupled to the outputs of the pulse generator 107 to receive the enable signal SAEN and invert the enable signal SAEN to generate the inverted enable signal SAENb.

Memory cells in the LRS can conduct current in response to a suitable bias, whereas memory cells in the HRS will not conduct an appreciable current. The memory cells in the LRS resulting in the voltage divider effect on an associated source line. The voltage divider effect will measurably reduce the voltage on the associated source line, which indicates a comparative result of the resistance state of memory cell on the associated source line and the input signal. When all of memory cells are in HRS, the voltage at the associated source line will be approximately equal to the voltage supplied to the associated source line. Each of the sense amplifiers 113 is coupled to one of the source lines and a reference voltage (not shown) and is configured to sense the voltage levels of the source line compared to the reference voltage according to the enable signal SAEN. In the present embodiment, the sense amplifier 113 which is coupled to the source line SL0 senses the voltage level in the source line SL0 compared to the reference voltage and output a product term PT0 when the enable signal SAEN indicates that there is the transition in levels in at least one of the input lines 102 and 104. For example, as depicted by FIG. 1, the resistance states of the memory cells coupled to the source line SL0 are HRS, LRS, LRS, and HRS (from left to right). According to such pattern of resistance states, memory cells in LRS and coupled to a high signal provided by the word lines WL1 and WL2 will pull down the default voltage on the source line SL0. Memory cells either in HRS, or coupled to a low signal provided by the word lines WL0 to WL3 will not affect (or not substantially affect) the default voltage on the source line SL0. Accordingly, a high signal on the input line 102, and a low signal on the input line 104 will result in the default voltage on the source line SL0. Therefore, the product term PT0 will be logical "1", which equals to a logical AND of signals A and $\overline{B}$ (represented as A*$\overline{B}$), which corresponds to memory cells MC in the HRS and coupled to the source line SL0. Otherwise, the default voltage on the source line SL0 will be reduced, such that the product term PT0 will be logical "0". When there is no transition in levels in the at least one of the input lines 102 and 104, the sense amplifier 113 is disabled from sensing the voltage value of the source lines SL0.

The sense amplifier 113 which is coupled to the source line SL1 operates in a similar manner as described above. Namely, the sense amplifier 113 which is coupled to the source line SL1 senses the voltage level in the source line SL1 and output a product term PT1 when the enable signal SAEN indicates that there is the transition in levels in at least one of the input lines 102 and 104. For example, as depicted by FIG. 1, the resistance states of the memory cells coupled to the source line SL1 are LRS, HRS, HRS, and LRS (from left to right). According to such pattern of resistance states, when memory cells in LRS are coupled to a high signal provided by the word lines WL0 and WL3, the default voltage on the source line SL1 will be pulled down. In contrast, memory cells either in HRS, or coupled to a low signal provided by the word lines WL0 to WL3 will not affect (or not substantially affect) the default voltage on the source line SL1. Accordingly, a low signal on the input line 102, and a high signal on the input line 104 will result in the default voltage on the source line SL1. Therefore, the product term PT1 will be logical "1", which equals to a logical AND of signals $\overline{A}$ and B (represented as $\overline{A}$*B), which corresponds to memory cells MC in the HRS and coupled to the source line SL1. Otherwise, the default voltage on the source line SL1 will be reduced, such that the product term PT1 will be logical "0".

Table 1 shows a truth table for illustrating the values of the logical AND of signals A and $\overline{B}$ (represented as A*$\overline{B}$) and the logical AND of signals $\overline{A}$ and B (represented as $\overline{A}$*B). Each of the input lines 102 and 104 is associated with a high signal (represented as "1") or low signal (represented as "0"), which represents respective binary states for a parameter of the truth table as shown in Table 1.

TABLE 1

| Input signal on the input line 102 | Input signal on the input line 104 | A * $\overline{B}$ | $\overline{A}$ * B |
|---|---|---|---|
| 0 | 0 | 0 | 0 |
| 0 | 1 | 0 | 1 |
| 1 | 0 | 1 | 0 |
| 1 | 1 | 0 | 0 |

The latches 117 are coupled to the outputs of the sense amplifiers 113 through switches 115, where the switches 115 are controlled according to the enable signal SAEN. In other words, when there is transition in levels in at least one of the input lines 102 and 104, the switches 115 are switched on to electrically connect the latches 117 with the outputs of the sense amplifier 113. In this way, the values stored in the latches 117 may be updated or the values to be stored in the latches 117 may be provided by the sense amplifier 113. Therefore, the product terms PT0 and PT1 can be reserved by the latches 117. On the other hand, when there is no transition in levels in at least one of the input lines 102 and 104, the switches 115 are switched off, thereby electrically isolating the latches 117 from the outputs the sense amplifier 113. In FIG. 1, each of the latches 117 may comprise two inverters connected back-to-back to each other (output of one inverter is provided to the input of the other inverter and vice versa). However, the disclosure should not be limited thereto, and any type of latches may be use as long as the latches provide the desired functions.

The PAL circuit 100 may further include pull-up circuits 111 which are coupled to the source lines SL0 and SL1. The pull-up circuits 111 are configured to provide the default voltage for the source lines according to the inverted enable signal SAENb. When there is transition in levels in at least one of the input lines 102 and 104, the pull-up circuits 111 may be enabled to provide the default voltage to the source lines. When there is no transition in the levels in at least one of the input lines 102 and 104, the pull-up circuits 111 may be disabled. The default voltage may be a supply voltage (e.g., Vdd), but the disclosure is not limited thereto.

Figure 2A:
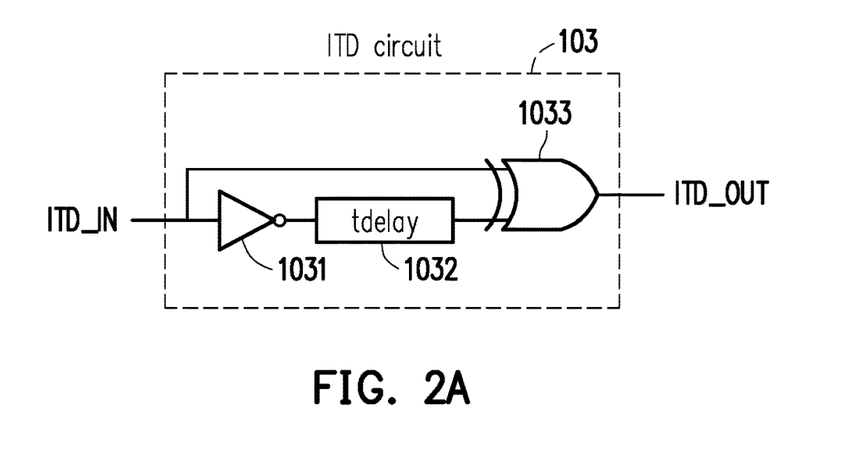
FIGS. 2A to 2C illustrate a detailed structure of an input transition detection (ITD) circuit, and waveforms of an input signal, signals outputted from ITD circuits, and an enable signal according to an embodiment of the disclosure.

The third logical circuit 119 has a plurality of input terminals coupled to the connection nodes between the outputs of the sense amplifier 113 and the switches 115. The third logical circuit 119 may be or include an OR logical gate or an XOR logical gate which is configured to perform an OR operation or an XOR operation on the signals received from the input terminals to obtain an output signal. For example, if a first input terminal of the third logical circuit 119 receives the signal of A*$\overline{B}$ and the second input terminal of the third logical circuit 119 receives the signal of $\overline{A}$*B, the third logical circuit 119 may output the signal of (A XOR B) or (A⊕B). FIG. 2A illustrates the detailed structure of one of the ITD circuits 103 according to an embodiment of the disclosure. The ITD circuit 103 may include an inverter 1031, a delay circuit 1032 and a second logical circuit 1033. The inverter 1031 receives the input signal ITD_IN from one of the input lines and inverts the received input signal ITD_IN to generate an inverted input signal. The delay circuit 1032 is coupled to the inverter 1031 and is configured to delay the inverted input signal to generate a delayed signal. For instance, the delay circuit 1032 may include even-numbered inverters connected in series. The second logical circuit 1303 receives the input signal ITD_IN and the delayed signal, and is configured to generate one of the ITD signals ITD_OUT. In an embodiment, the second logical circuit 1303 includes an XOR logical gate performing an XOR operation on the input signal and the delayed signal to generate one of the ITD signals ITD_OUT.

Figure 2B:
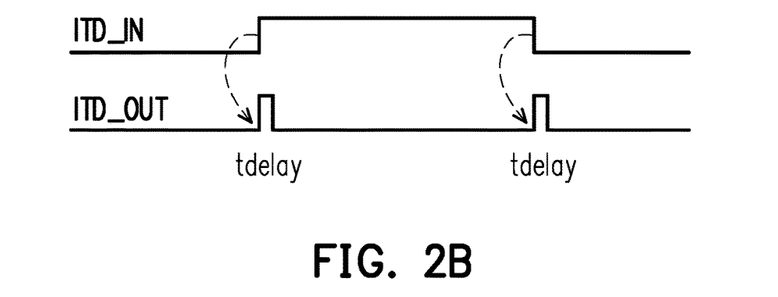

FIG. 2B illustrates the waveforms of the input signal ITD_IN and the output signal ITD_OUT according to an embodiment of the disclosure. In FIG. 2B, in response to a rising edge or a falling edge of the input signal ITD_IN, the output signal ITD_OUT outputs a delay pulse, which the width of the delay pulses may indicate the amount of delay time tdelay. The delay pulses as illustrated in FIG. 2B may be used to detect the transition in levels of the input signal ITD_IN.

Figure 2C:
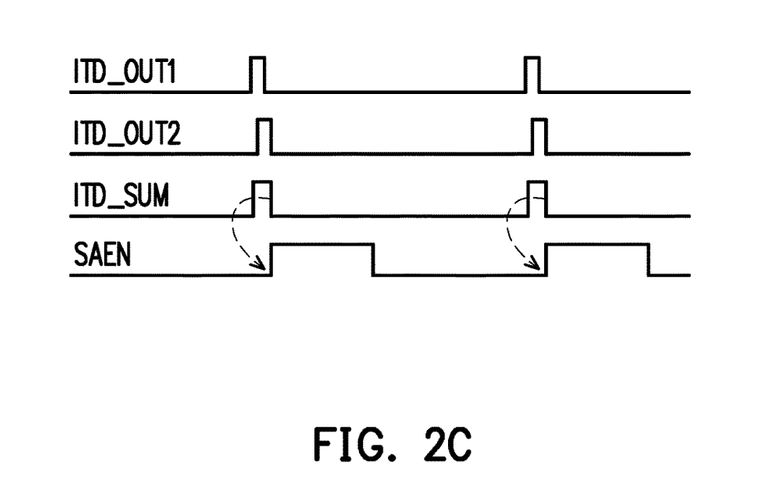

FIG. 2C shows waveforms of the ITD signals (ITD_OUT signals) outputted from the ITD circuits, a summed ITD signal (ITD_SUM), and an enable signal (SAEN) according to an embodiment of the disclosure. Referring to FIG. 1 and FIG. 2A-2C, the ITD signals outputted from the ITD circuits 103 are summed up by the first logical circuit 105 to generate the summed ITD signal (ITD_SUM), where the summed ITD signal ITD_SUM may include at least one of delay pulse indicating transition in level of different input signals ITD_IN. The pulses in the enable signal SAEN are generated according to the at least one of delay pulses in the summed ITD signal ITD_SUM. The enable signal SAEN may be inverted to generate the inverted enable signal SAENb. Once the enable signal SAEN and the inverted enable signal SAENb are generated, these signals may be used to control the operations of the pull-up circuits 111, the sense amplifiers 113, and the switches 115.

Figure 3:
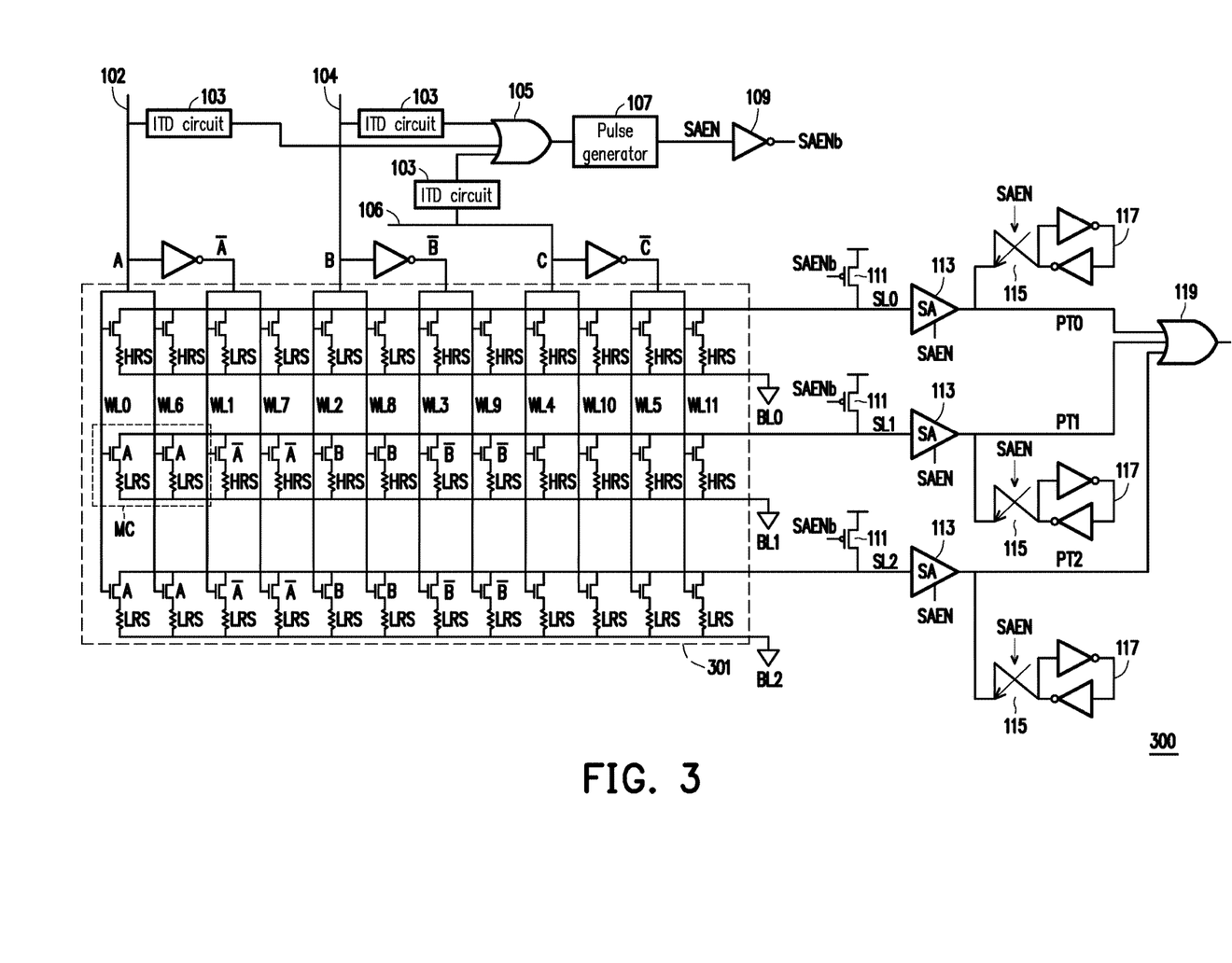
FIG. 3 illustrates a schematic diagram of a PAL circuit according to another embodiment of the disclosure.

Referring now to FIG. 3, a schematic diagram of a PAL circuit 300 according to another embodiment of the disclosure is illustrated. In comparison to the PAL circuit 100 shown in FIG. 1, the PAL circuit 300 includes three ITD circuits 103 coupled to three input lines 102, 104, and 106 respectively, and the first logical circuit 105 receives the output of each ITD circuit 103 and is configured to sum up all the received ITD signals to output a summed ITD signal ITD_SUM. In addition, the PAL circuit 300 includes a memory array 301 including the memory cells each includes two transistors and two resistive-switching elements (i.e. 2T2R architecture). Accordingly, the PAL circuit 300 includes 12 word lines WL0 to WL 11 each coupled to a corresponding column of transistors of the memory cells. If a transition in levels of at least one of the three input signals A, B and C is detected, an enable signal is generated to enable the corresponding one(s) of the sense amplifiers. Otherwise, the sense amplifiers are disabled if no transition in levels is detected. In this way, read disturbance effect to memory cells are prevented and the reliability of the PAL circuit is improved. In one embodiment, to generate product terms coming from a less number of the input lines, a corresponding number of the input lines can be floated to be an unused input line, and memory cells on a corresponding unused one(s) of the source lines can be programed to be in LRS. For example, to generate product terms coming from the input lines 102 and 104 like the PAL circuit 100 shown in FIG. 1, the input line 106 and the source lines SL2 can be the unused input line and the unused source line. In detail, the resistance values of memory cells that are on the source lines SL0 and SL1 and coupled to the input line 106 are set to be HRS by floating the word lines WL4, WL5, WL10 and WL11, and the resistance values of the memory cells that are coupled to the unused source line SL2 are set to LRS by applying the program voltage to word lines WL0 to WL11. Therefore, the default voltages on the source lines SL0 and SL1 will not be affected by the input signals C and $\overline{C}$. And, the default voltage on the source line SL2 are always reduced whether input signals A, B, C, $\overline{A}$, $\overline{B}$ and $\overline{C}$ are high or low. That is, the product term PT2 is always logical "0".

It should be noticed that any type of the memory falls within the scope of the disclosure, and the type of the memory may be selected based on the designed requirements. For example, since the "4T4R" memory type and "2T2R" memory type have higher reliability compared with "1T1R" memory type, "4T4R" memory type and "2T2R" memory type may be used for the PAL circuit that require high reliability.

In one embodiment, the PAL circuit may be or may include a 22V10 PAL circuit (PAL circuit with 22V10 architecture) with 2T2R memory cells, where includes eleven input lines configured to receive eleven input signals. Similar to the circuit diagrams shown in FIG. 1 and FIG. 3, eleven ITD circuits may be designed to detect transition in levels of the eleven input signals. If a transition in levels of at least one of the eleven input signals is detected, an enable signal is generated to enable the corresponding one(s) of the sense amplifiers. Otherwise, the sense amplifiers are disabled if no transition in levels is detected. In this way, read disturbance effect to memory cells are prevented and the reliability of the PAL circuit is improved. Besides, to generate product terms coming from a less number of the input lines, a corresponding number of the input lines can be floated to be an unused input line, and memory cells on a corresponding unused one(s) of the source lines can be programed to be in LRS.

Figure 4:
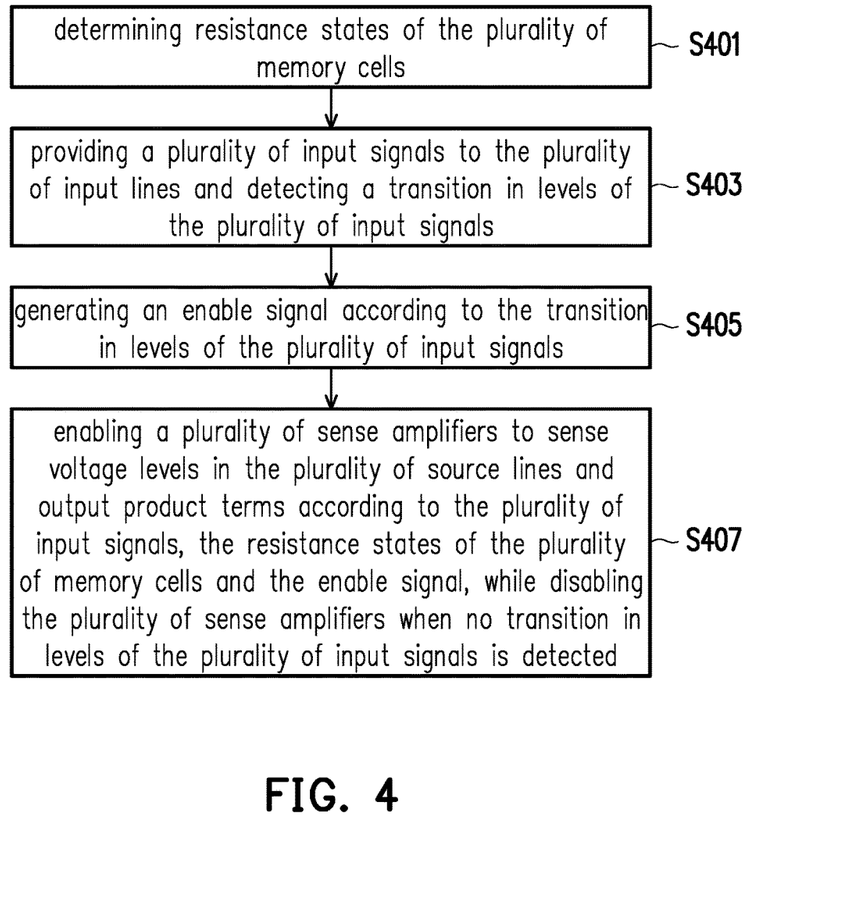
FIG. 4 is a flowchart illustrating steps of a method of performing an operation on the PAL circuit according to an embodiment of the disclosure.

Referring to FIG. 4, a method of performing an operation on a programmable array logic (PAL) circuit having a plurality of memory cells coupled to a plurality of input lines and a plurality of source lines are illustrated. In step S401, resistance states of the memory cells are determined. For example, as depicted by FIG. 1, by applying the erase voltage to the word lines WL0 and WL3 and applying the program voltage to the word lines WL1 and WL2, the resistance states of the memory cells coupled to the source line SL0 are HRS, LRS, LRS, and HRS (from left to right) as depicted by FIG. 1. In step S403, a plurality of input signals are provided to the input lines and a transition in levels of input signals in the input lines is detected. Each of the input lines may be coupled to one ITD circuit which is configured to detect the transition in levels of the input signal in the input line and output an ITD signal indicating whether the transition in levels of the input signal is detected. In an embodiment, the input signal is inverted to generate an inverted input signal, and the inverted input signal is delayed to generate a delayed signal. The ITD signal is output according to the input signal and the delayed signal. In an embodiment, an XOR operation is performed on the input signal and the delayed signal to obtain the ITD signal.

In step S405, an enable signal is generated according to the transition in levels of input signals in the input lines. In some embodiments of the disclosure, the ITD signals outputted from the ITD circuits are summed up to generate a summed ITD signal which is then used to generate the enable signal. In an embodiment, an OR operation on the ITD signals may be performed to generate the summed ITD signal. The enable signal may indicate whether the transition in levels of the input signals occurs in any of the input lines.

In an embodiment, the enable signal may be further inverted to generate an inverted enable signal. And, a plurality of pull-up circuits may be further controlled according to the inverted enable signal, wherein the pull-up circuits are coupled to the memory cells through the source lines and are configured to provide a default voltage to the source lines.

In step S407, a plurality of sense amplifiers is enabled to sense voltage levels in the source lines and output product terms according to the input signals, the resistance states of the memory cells and the enable signal. Meanwhile, a corresponding sense amplifier(s) is disabled when no transition in levels of the input signals provided to one of the input lines is detected.

In an embodiment, a plurality of switches coupled to the sense amplifiers may be further controlled according to the enable signal. A plurality of latches may be further coupled to the sense amplifiers through the switches. And, a logical operation may be further performed on the signals received from connection nodes between the sense amplifiers and the switches to obtain an output signal. In an embodiment, the logical operation may be an XOR operation.

The embodiments of the disclosure introduce a PAL circuit and a method of performing an operation on the PAL circuit which are capable of reducing or preventing the read disturbance effect to memory cells of the PAL circuit, thereby improving the performance and reliability of the PAL circuit. A plurality of ITD circuits are configured to detect the transition in levels of the input signals in the input lines. A pulse generator is configured to generate an enable signal which may indicate whether there is the transition in levels of the input signals. The sense amplifiers are enabled to sense the voltage levels of the source lines when the transition in levels of the input signals is detected, and the sense amplifiers are disabled when no transition in levels of the input signals is detected. In this way, the read disturbance effect to memory cells are reduced or prevented and the reliability of the PAL circuit is improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A programmable array logic (PAL) circuit, comprising:
    a memory array, comprising a plurality of memory cells coupled to a plurality of source lines and a plurality of input lines to receive a plurality of input signals;
    a plurality of input transition detection (ITD) circuits, coupled to the plurality of input lines and configured to detect a transition in levels of the plurality of input signals;
    a pulse generator, coupled to the plurality of ITD circuits and configured to generate an enable signal according to the transition in levels of the plurality of input signals; and
    a plurality of sense amplifiers, coupled to the plurality of source lines and configured to sense voltage levels of the plurality of source lines according to the enable signal,
    wherein the plurality of sense amplifiers are enabled to sense the voltage levels of the plurality of source lines when the transition in levels of the plurality of input signals is detected, and the plurality of sense amplifiers are disabled when no transition in levels of the plurality of input signals is detected.

2. The PAL circuit of claim 1, further comprising:
    a first logical gate coupled between the ITD circuit and the pulse generator and is configured to sum up ITD signals generated by the ITD circuits to output a summed ITD signal, and wherein
    each of the ITD circuits is coupled to a corresponding one of the input lines and is configured to output one of the ITD signals that indicates whether the transition in levels of the input signal in the corresponding one of the input lines is detected,
    the pulse generator generates the enable signal according to the summed ITD signal.

3. The PAL circuit of claim 2, wherein each of the ITD circuits comprises:
    an inverter, configured to invert the input signal to generate an inverted input signal;
    a delay circuit, coupled to the inverter and configured to delay the inverted input signal to generate a delayed signal; and
    a second logical circuit, configured to receive the input signal and the delayed signal and output the ITD signal corresponding to the input signal.

4. The PAL circuit of claim 3, wherein the second logical circuit comprises an XOR logical gate.

5. The PAL circuit of claim 2, wherein the first logical circuit comprises an OR logical gate, and the summed ITD signal is obtained by performing an OR operation on the ITD signals.

6. The PAL circuit of claim 1, further comprising:
    a plurality of switches, coupled to the sense amplifiers and controlled according to the enable signal; and
    a plurality of latches, coupled to the sense amplifiers through the plurality of switches.

7. The PAL circuit of claim 6, further comprising:
    a third logical circuit, coupled to connection nodes between the sense amplifiers and the switches and configured to perform a logical operation on the signals received from the connection nodes to obtain an output signal.

8. The PAL circuit of claim 7, wherein the third logical circuit comprises an OR logical gate, and the third logical circuit performs an OR operation on the signals received from the connection nodes.

9. The PAL circuit of claim 1, further comprising:
    an inverter, coupled to the pulse generator and configured to invert the enable signal to generate an inverted enable signal; and
    a plurality of pull-up circuits, coupled to the source lines and configured to provide a default voltage to the source lines according to the inverted enable signal.

10. The PAL circuit of claim 1, wherein the plurality of memory cells supports a simple write operation which does not requires an erase operation before performing the simple write operation.

11. The PAL circuit of claim 1, wherein the plurality of memory cells are resistive random access memory (RRAM) cells.

12. The PAL circuit of claim 1, wherein the memory array is further coupled to at least one unused input line and at least one unused source line, resistance values of memory cells coupled to the at least one unused input line are set to a high resistance state, and resistance values of memory cells coupled to the at least one unused source line are set to a low resistance state.

13. A method of performing an operation on a programmable array logic (PAL) circuit having a plurality of memory cells coupled to a plurality of input lines and a plurality of source lines, comprising:

determining resistance states of the plurality of memory cells;

providing a plurality of input signals to the plurality of input lines and detecting a transition in levels of the plurality of input signals;

generating an enable signal according to the transition in levels of the plurality of input signals; and enabling a plurality of sense amplifiers to sense voltage levels in the plurality of source lines and output product terms according to the plurality of input signals, the resistance states of the plurality of memory cells and the enable signal, while disabling the plurality of sense amplifiers when no transition in levels of the plurality of input signals is detected.

14. The method of claim 13, wherein the step of providing the plurality of input signals to the plurality of input lines and detecting the transition in levels of the plurality of input signals comprises:

outputting an ITD signal indicating whether the transition in levels of the input signal is detected; and summing up the ITD signals in the input lines to output a summed ITD signal, wherein the step of generating the enable signal according to the transition in levels of the plurality of input signals comprises generating the enable signal according to the summed ITD signal.

15. The method of claim 14, wherein the step of outputting the ITD signal comprises:

inverting the input signal to generate an inverted input signal;

delaying the inverted input signal to generate a delayed signal; and outputting the ITD signal according to the input signal and the delayed signal.

16. The method of claim 15, wherein the step of outputting the ITD signal according to the input signal and the delayed signal comprises:

performing an XOR operation on the input signal and the delayed signal to obtain the ITD signal.

17. The method of claim 14, wherein the step of summing up the ITD signals in the input lines to output the summed ITD signal comprises:

performing an OR operation on the ITD signals to generate the summed ITD signal.

18. The method of claim 13, further comprising:

inverting the enable signal to generate an inverted enable signal; and controlling a plurality of pull-up circuits according to the inverted enable signal, wherein the plurality of pull-up circuits are coupled to the plurality of memory cells through the plurality of source lines and are configured to provide a default voltage to the plurality of source lines.

19. The method of claim 13, further comprising:

controlling a plurality of switches coupled to the sense amplifiers according to the enable signal;

coupling a plurality of latches coupled to the sense amplifiers through the plurality of switches; and performing a logical operation on the signals received from connection nodes between the sense amplifiers and the switches to obtain an output signal.

20. The method of claim 19, wherein the logical operation is an XOR operation.

* * * * *